(12) United States Patent
Kitada et al.

(10) Patent No.: US 11,312,137 B2
(45) Date of Patent: Apr. 26, 2022

(54) PIEZOELECTRIC ELEMENT, LIQUID DISCHARGE HEAD, AND PRINTER

(71) Applicant: Seiko Epson Corporation, Tokyo (JP)

(72) Inventors: Kazuya Kitada, Matsumoto (JP); Masayuki Omoto, Chino (JP); Hidemichi Furihata, Chino (JP); Kazuhide Gomi, Suwa (JP); Hidetoshi Tako, Chino (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/844,061

(22) Filed: Apr. 9, 2020

(65) Prior Publication Data

US 2020/0324546 A1 Oct. 15, 2020

(30) Foreign Application Priority Data

Apr. 10, 2019 (JP) .............................. JP2019-074755

(51) Int. Cl.
*B41J 2/14* (2006.01)
*H01L 41/187* (2006.01)
*H01L 41/047* (2006.01)

(52) U.S. Cl.
CPC ...... *B41J 2/14233* (2013.01); *H01L 41/0471* (2013.01); *H01L 41/0472* (2013.01); *H01L 41/0477* (2013.01); *H01L 41/1873* (2013.01)

(58) Field of Classification Search
None
See application file for complete search history.

(56) References Cited

U.S. PATENT DOCUMENTS

| 2008/0308762 | A1 | 12/2008 | Ueno et al. |
| 2009/0015109 | A1* | 1/2009 | Schuh ................. H01L 41/0471 310/364 |
| 2015/0280103 | A1* | 10/2015 | Kobayashi ............. B41J 2/1634 347/68 |

FOREIGN PATENT DOCUMENTS

JP 2011-155272 A 8/2011

* cited by examiner

*Primary Examiner* — Erica S Lin
(74) *Attorney, Agent, or Firm* — Harness, Dickey & Pierce, P.L.C.

(57) ABSTRACT

A piezoelectric element includes: a first electrode provided on a base; a piezoelectric layer provided on the first electrode and containing a complex oxide which has a perovskite structure and contains potassium, sodium, and niobium; and a second electrode provided on the piezoelectric layer, in which the first electrode contains platinum, the first electrode is (111) preferentially oriented, and a platinum atom contained in the first electrode is bonded to an oxygen atom at an interface between the first electrode and the piezoelectric layer.

4 Claims, 5 Drawing Sheets

PIEZOELECTRIC ELEMENT, LIQUID DISCHARGE HEAD, AND PRINTER

The present application is based on, and claims priority from JP Application Serial Number 2019-074755, filed Apr. 10, 2019, the disclosure of which is hereby incorporated by reference herein in its entirety.

BACKGROUND

1. Technical Field

The present disclosure relates to a piezoelectric element, a liquid discharge head, and a printer.

2. Related Art

From a viewpoint of reducing environmental load, a non-lead-based piezoelectric material in which use of a harmful substance such as lead is avoided has been developed. As such a non-lead-based piezoelectric material, potassium sodium niobate ((K, Na) NbO$_3$: KNN) is considered promising.

For example, JP-A-2011-155272 discloses that an orientation of a piezoelectric layer formed of KNN is controlled using an orientation control layer formed of lanthanum nickel oxide.

However, in JP-A-2011-155272, the lanthanum nickel oxide may diffuse into the piezoelectric layer. Accordingly, a leakage current of the piezoelectric element may be increased.

SUMMARY

An object of the present disclosure is to control the orientation of the piezoelectric layer containing potassium, sodium, and niobium without using the lanthanum nickel oxide as the orientation control layer.

A piezoelectric element according to an aspect of the present disclosure includes: a first electrode provided on a base; a piezoelectric layer provided on the first electrode and containing a complex oxide which has a perovskite structure and contains potassium, sodium, and niobium; and a second electrode provided on the piezoelectric layer, in which the first electrode contains platinum, the first electrode is (111) preferentially oriented, and a platinum atom contained in the first electrode is bonded to an oxygen atom at an interface between the first electrode and the piezoelectric layer.

In the piezoelectric element, the piezoelectric layer may be (100) preferentially oriented.

In the piezoelectric element, an atomic concentration of carbon at the interface may be 19.0 at % or less.

A liquid discharge head according to an aspect of the present disclosure includes: the piezoelectric element according to the aspect; a nozzle plate provided with a nozzle hole from which a liquid is discharged, in which the base includes a flow path formation substrate provided with a pressure generation chamber whose volume is changeable by the piezoelectric element, and the nozzle hole communicates with the pressure generation chamber.

A printer according to an aspect of the present disclosure includes: the liquid discharge head according to the aspect; a transport mechanism configured to move a recording medium relative to the liquid discharge head; and a control unit configured to control the liquid discharge head and the transport mechanism.

DESCRIPTION OF EXEMPLARY EMBODIMENTS

Hereinafter, a preferred embodiment of the present disclosure will be described in detail with reference to the drawings. It should be noted that the embodiment to be described below does not unduly limit contents of the present disclosure described in the appended claims. Further, not all the configurations described below are necessarily essential components of the present disclosure.

1. Piezoelectric Element

Figure 1:
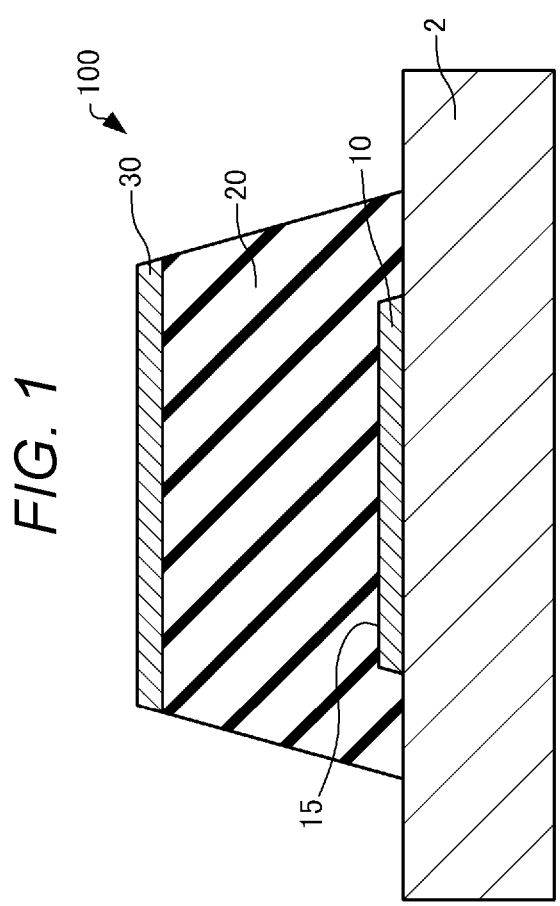
FIG. 1 is a cross-sectional view schematically showing a piezoelectric element according to the present embodiment.

First, a piezoelectric element according to the present embodiment will be described with reference to the drawings. FIG. 1 is a cross-sectional view schematically showing a piezoelectric element 100 according to the present embodiment.

As shown in FIG. 1, the piezoelectric element 100 includes a first electrode 10, a piezoelectric layer 20, and a second electrode 30. The piezoelectric element 100 is provided on a base 2.

The base 2 is, for example, a flat plate formed of a semiconductor, an insulator, or the like. The base 2 may be a single layer or a laminated body in which a plurality of layers are laminated. As long as an upper surface is planar, an internal structure of the base 2 is not limited. The base 2 may have a structure in which a space or the like is formed.

The base 2 may be a vibration plate having flexibility and being deformed by an operation of the piezoelectric layer 20. The vibration plate is, for example, a silicon oxide layer, a zirconium oxide layer, or a laminated body in which a zirconium oxide layer is provided on a silicon oxide layer.

The first electrode 10 is provided on the base 2. In the shown example, the first electrode 10 is provided on the base 2. The first electrode 10 is provided between the base 2 and the piezoelectric layer 20. The first electrode 10 is, for example, in a shape of a layer. A thickness of the first electrode 10 is, for example, 3 nm or more and 200 nm or less. The first electrode 10 contains platinum. The first electrode 10 is, for example, a platinum layer.

The first electrode 10 is (111) preferentially oriented. Here, "the first electrode 10 is (111) preferentially oriented" means that with respect to a total $I_{ALL}$ of all peak intensities derived from the first electrode 10, a proportion $I_{(111)}/I_{ALL}$ of a peak intensity $I_{(111)}$ derived from the (111) plane of the first electrode 10 is 0.70 or more in an X-ray diffraction intensity curve obtained by X-ray diffraction (XRD) measurement.

The first electrode 10 is one of electrodes that apply a voltage to the piezoelectric layer 20. The first electrode 10 is a lower electrode provided under the piezoelectric layer 20.

Although not shown, an adhesion layer, which improves adhesion between the first electrode 10 and the base 2, may be provided between the first electrode 10 and the base 2. Examples of the adhesion layer include a titanium layer and a titanium oxide layer. In this case, the first electrode 10 is provided, via the adhesion layer, on the base 2.

The piezoelectric layer 20 is provided on the first electrode 10. In the shown example, the piezoelectric layer 20 is provided on both the first electrode 10 and the base 2. The piezoelectric layer 20 is provided between the first electrode 10 and the second electrode 30. A thickness of the piezoelectric layer 20 is, for example, 200 nm or more and 2 μm or less. The piezoelectric layer 20 can be deformed by applying a voltage between the first electrode 10 and the second electrode 30.

The piezoelectric layer 20 contains a complex oxide having a perovskite structure and containing potassium (K), sodium (Na), and niobium (Nb). The piezoelectric layer 20 is, for example, a KNN layer formed of KNN. The piezoelectric layer may further contain manganese (Mn). That is, the piezoelectric layer 20 may be a KNN layer to which the manganese is added. A leakage current of the piezoelectric element 100 can be reduced by containing the manganese in the piezoelectric layer 20. Accordingly, the piezoelectric layer 20 may contain additives other than the potassium, the sodium, the niobium, and oxygen (O).

The piezoelectric layer 20 is (100) preferentially oriented. Here, "the piezoelectric layer 20 is (100) preferentially oriented" means that with respect to a total $I_{ALL}$ of all peak intensities derived from the piezoelectric layer 20, a proportion $I_{(100)}/I_{ALL}$ of a peak intensity $I_{(100)}$ derived from the (100) plane of the piezoelectric layer 20 is 0.70 or more in the X-ray diffraction intensity curve obtained by the XRD measurement. The proportion $I_{(100)}/I_{ALL}$ is an orientation rate of the (100) plane of the piezoelectric layer 20.

Here, a crystal structure of the piezoelectric layer 20 is treated as a pseudo-cubic crystal in terms of a plane orientation, which is to simplify description because it is difficult to accurately identify the crystal structure of the thin film-shaped piezoelectric layer 20. However, treating the crystal structure of the piezoelectric layer 20 as the pseudo-cubic crystal in terms of the plane orientation does not deny that the crystal structure of the piezoelectric layer 20 has an ABO3 structure having symmetry lower than that of the pseudo-cubic crystal, for example, a tetragonal crystal, an orthorhombic crystal, a monoclinic crystal, and a rhombohedral crystal.

At an interface 15 between the first electrode 10 and the piezoelectric layer 20, platinum atoms contained in the first electrode 10 are bonded to oxygen atoms. In the shown example, the interface 15 is an upper surface of the first electrode 10. The binding between the platinum atoms and the oxygen atoms at the interface 15 can be confirmed by, for example, depth direction analysis based on X-ray photoelectron spectroscopy (XPS) or Auger electron spectroscopy (AES). Alternatively, the binding between the platinum atoms and the oxygen atoms can be confirmed by performing the XPS or the AES on the upper surface of the first electrode 10 after the piezoelectric layer 20 is peeled off by a predetermined method.

At the interface 15, the number of the platinum atoms bonded to the oxygen atoms among a plurality of platinum atoms contained in the first electrode 10 is not particularly limited. For example, the platinum atoms and the oxygen atoms may be bonded to an extent that a platinum oxide layer formed of platinum oxide is formed at the interface 15. In this case, the first electrode 10 includes the platinum oxide layer, and the platinum oxide layer constitutes the interface 15.

At the interface 15 between the first electrode 10 and the piezoelectric layer 20, an atomic concentration of carbon (C) is, for example, less than 19.0 at %, and preferably 13.5 at % or less. The atomic concentration of the carbon at the interface 15 can be calculated based on, for example, a peak intensity obtained by the XPS or the AES. The carbon is an impurity unintentionally mixed during manufacture and the like of the piezoelectric element 100.

The second electrode 30 is provided on the piezoelectric layer 20. In the shown example, the second electrode 30 is provided on the piezoelectric layer 20. Although not shown, as long as the second electrode 30 is electrically separated from the first electrode 10, the second electrode 30 may also be provided on a side surface of the piezoelectric layer 20 and the base 2.

The second electrode 30 is, for example, in a shape of a layer. A thickness of the second electrode 30 is, for example, 15 nm or more and 300 nm or less. Examples of the second electrode 30 include a metal layer such as an iridium layer, a platinum layer, and a ruthenium layer, a conductive oxide layer of the metal layer, a strontium ruthenate layer (SrRuO$_3$: SRO), and a lanthanum nickel oxide (LaNiO$_3$:LNO) layer. The second electrode 30 may have a structure in which a plurality of layers exemplified above is laminated.

The second electrode 30 is the other one of the electrodes that apply a voltage to the piezoelectric layer 20. The second electrode 30 is an upper electrode provided on the piezoelectric layer 20.

The piezoelectric element 100 has, for example, the following features.

In the piezoelectric element 100, the first electrode 10 contains platinum. The first electrode 10 is (111) preferentially oriented. At the interface 15 between the first electrode 10 and the piezoelectric layer 20, the platinum atoms contained in the first electrode 10 are bonded to the oxygen atoms. Therefore, in the piezoelectric element 100, compared with a case where the platinum atoms contained in the first electrode are not bonded to the oxygen atoms at the interface between the first electrode and the piezoelectric layer, the piezoelectric layer 20 can be easily (100) preferentially oriented and have a high orientation rate $I_{(100)}/I_{ALL}$ as shown in "5. Examples and Comparative Examples" to be described below. Therefore, in the piezoelectric element 100, the piezoelectric layer 20 can be (100) preferentially oriented without providing an orientation control layer formed of LNO between the first electrode 10 and the piezoelectric layer 20. Accordingly, in the piezoelectric element 100, the orientation of the piezoelectric layer 20 can be controlled without using lanthanum nickel oxide as the orientation control layer. Therefore, it is possible to prevent the leakage current from increasing due to diffusion of the LNO into the piezoelectric layer 20. Further, since the piezoelectric layer 20 has the high orientation rate $I_{(100)}/I_{ALL}$, a crack is not likely to occur in the piezoelectric layer 20, and the thickness of the piezoelectric layer 20 can be increased.

2. Method for Manufacturing Piezoelectric Element

Next, a method for manufacturing the piezoelectric element 100 according to the present embodiment will be described with reference to the drawings.

As shown in FIG. 1, the base 2 is prepared. Specifically, a silicon oxide layer is formed by thermally oxidizing a silicon substrate. Next, a zirconium layer is formed at the silicon oxide layer by a sputtering method or the like, and a zirconium oxide layer is formed by thermally oxidizing the zirconium layer. Through the steps described above, the base 2 can be prepared.

Next, the first electrode 10 is formed on the base 2. The first electrode 10 is formed by, for example, the sputtering method or a vacuum deposition method. Next, the first electrode 10 is patterned by, for example, photolithography and etching.

Next, the upper surface of the first electrode 10 is subjected to oxygen plasma ashing performed by an oxygen plasma ashing apparatus. Processing time of the oxygen plasma ashing is, for example, 0.5 minutes or more, and preferably 0.5 minutes or more and 5 minutes or less.

Instead of the oxygen plasma asking, the upper surface of the first electrode 10 may be irradiated with UV of 172 nm by an ultraviolet (UV) lamp. Irradiation time of the UV is, for example, 5 minutes or more and 15 minutes or less.

Next, the piezoelectric layer 20 is formed on the first electrode 10. The piezoelectric layer 20 is formed by, for example, a chemical solution deposition (CSD) method such as a sol-gel method or metal organic deposition (MOD). A method for forming the piezoelectric layer 20 will be described below.

First, for example, a metal complex containing potassium, a metal complex containing sodium, a metal complex containing niobium, and a metal complex containing manganese are dissolved or dispersed in an organic solvent to prepare a precursor solution.

Examples of the metal complex containing potassium include potassium 2-ethylhexanoate and potassium acetate. Examples of the metal complex containing sodium include sodium 2-ethylhexanoate and sodium acetate. Examples of the metal complex containing niobium include niobium 2-ethylhexanoate, niobium ethoxide, pentaethoxyniobium, and pentabutoxyniobium. Examples of the metal complex containing manganese include manganese 2-ethylhexanoate and manganese acetate. Two or more metal complexes may be used in combination. For example, the potassium 2-ethylhexanoate and the potassium acetate may be used in combination as the metal complex containing potassium.

Examples of the solvent include propanol, butanol, pentanol, hexanol, octanol, ethylene glycol, propylene glycol, octane, decane, cyclohexane, xylene, toluene, tetrahydrofuran, acetic acid, octylic acid, 2-n-butoxyethanol, n-octane, 2-n-ethylhexane or a mixed solvent of these solvents.

Next, the prepared precursor solution is applied, using a spin coating method or the like, to the first electrode 10 to form a precursor layer. Next, the precursor layer is heated at, for example, 130° C. or higher and 250° C. or lower and dried for a certain period of time, and further, the dried precursor layer is heated at, for example, 300° C. or higher and 450° C. or lower and held for a certain period of time to degrease the precursor layer. Next, the degreased precursor layer is crystallized by being baked at, for example, 550° C. or higher and 800° C. or lower.

Then, a series of steps from the application of the precursor solution to the baking of the precursor layer are repeated a plurality of times. Accordingly, the piezoelectric layer 20 can be formed. Next, the piezoelectric layer 20 is patterned by, for example, the photolithography and the etching.

A heating apparatus used for the drying and the degreasing of the precursor layer is, for example, a hot plate. A heating apparatus used for the baking of the precursor layer is a rapid thermal annealing (RTA) apparatus.

Next, the second electrode 30 is formed at the piezoelectric layer 20. The second electrode 30 is formed by, for example, the sputtering method or the vacuum deposition method. Next, the second electrode 30 is patterned by, for example, the photolithography and the etching. The second electrode 30 and the piezoelectric layer 20 may be patterned in the same step.

Through the steps described above, the piezoelectric element 100 can be manufactured.

3. Liquid Discharge Head

Figure 2:
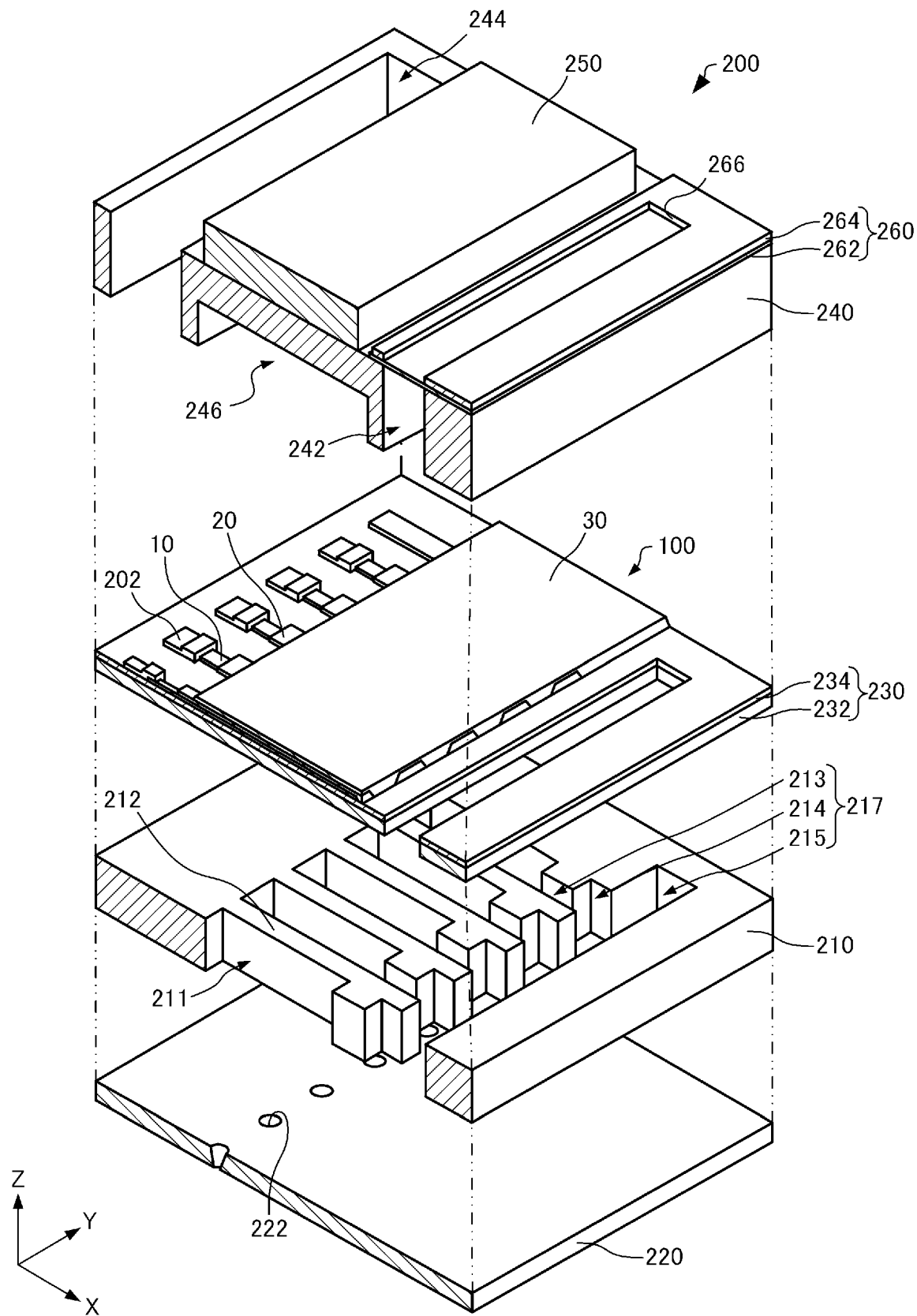
FIG. 2 is an exploded perspective view schematically showing a liquid discharge head according to the present embodiment.
Figure 3:
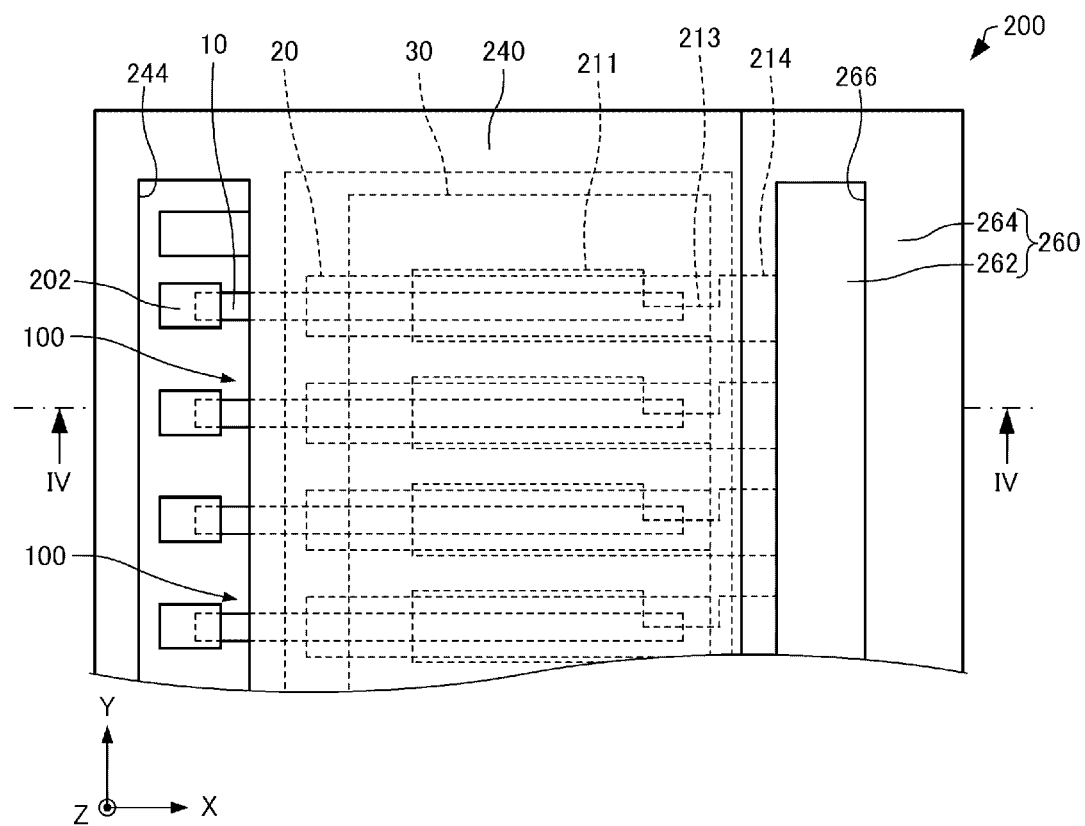
FIG. 3 is a plan view schematically showing the liquid discharge head according to the present embodiment.
Figure 4:
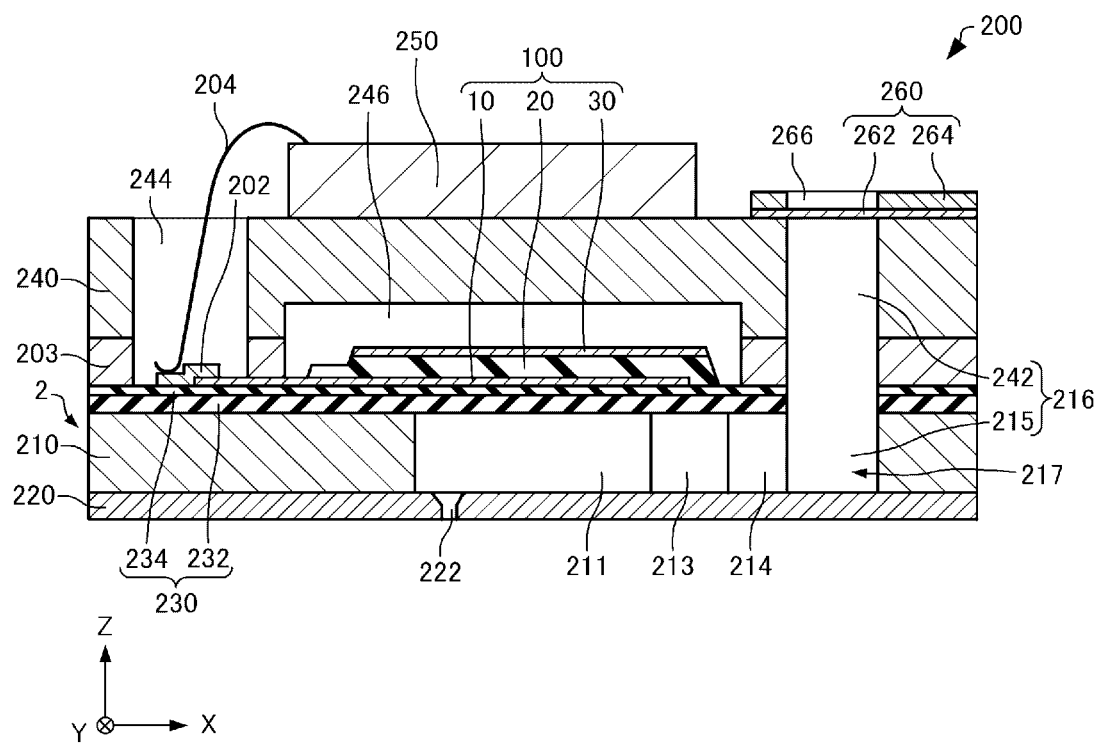
FIG. 4 is a cross-sectional view schematically showing the liquid discharge head according to the present embodiment.

Next, a liquid discharge head according to the present embodiment will be described with reference to the drawings. FIG. 2 is an exploded perspective view schematically showing a liquid discharge head 200 according to the present embodiment. FIG. 3 is a plan view schematically showing the liquid discharge head 200 according to the present embodiment. FIG. 4 is a cross-sectional view taken along a line IV-IV of FIG. 3 and schematically showing the liquid discharge head 200 according to the present embodiment. In FIGS. 2 to 4, an X axis, a Y axis, and a Z axis are shown as three axes orthogonal to one another. Further, in FIGS. 2 and 4, the piezoelectric element 100 is shown in a simplified way.

As shown in FIGS. 2 to 4, the liquid discharge head 200 includes, for example, the base 2, the piezoelectric elements 100, a nozzle plate 220, a protection substrate 240, a circuit substrate 250, and a compliance substrate 260. The base 2 includes a flow path formation substrate 210 and a vibration plate 230. For the sake of convenience, the circuit substrate 250 is not shown in FIG. 3.

The flow path formation substrate 210 is, for example, a silicon substrate. Pressure generation chambers 211 are provided in the flow path formation substrate 210. The pressure generation chambers 211 are partitioned by a plurality of partition walls 212. A volume of the pressure generation chamber 211 is changed by the piezoelectric element 100.

A first communication path 213 and a second communication path 214 are provided at an end of the flow path formation substrate 210 and of the pressure generation chamber 211 in a +X-axis direction. The first communication path 213 is configured such that an opening area of the first communication path 213 is reduced by narrowing, from a Y-axis direction, the end of the pressure generation chamber 211 in the +X-axis direction. A width of the second communication path 214 in the Y-axis direction is, for example, the same as a width of the pressure generation chamber 211 in the Y-axis direction. A third communication path 215 that communicates with a plurality of second communication paths 214 is provided in a +X-axis direction of the second communication paths 214. The third communication path 215 constitutes a part of a manifold 216. The manifold 216 serves as a common liquid chamber of the pressure generation chambers 211. Accordingly, the pressure generation chambers 211 and a supply flow path 217 which includes the first communication paths 213, the second communication paths 214, and the third communication path 215 are provided in the flow path formation substrate 210. The supply flow path 217 communicates with the pressure generation chambers 211 and supplies a liquid to the pressure generation chambers 211.

The nozzle plate 220 is provided on a surface on one side of the flow path formation substrate 210. A material of the nozzle plate 220 is, for example, steel use stainless (SUS). The nozzle plate 220 is bonded to the flow path formation substrate 210 by, for example, an adhesive or a heat-welding film. A plurality of nozzle holes 222 are provided in the nozzle plate 220 along the Y axis. The nozzle hole 222 communicates with the pressure generation chamber 211 and discharges a liquid.

The vibration plate 230 is provided on a surface on the other side of the flow path formation substrate 210. The vibration plate 230 includes, for example, a silicon oxide layer 232 provided on the flow path formation substrate 210, and a zirconium oxide layer 234 provided on the silicon oxide layer 232.

The piezoelectric elements 100 are provided, for example, on the vibration plate 230. A plurality of piezoelectric elements 100 are provided. The number of the piezoelectric elements 100 is not particularly limited.

In the liquid discharge head 200, the vibration plate 230 and the first electrodes 10 are displaced by deformation of the piezoelectric layers 20 having electromechanical conversion characteristics. That is, in the liquid discharge head 200, the vibration plate 230 and the first electrodes 10 substantially have a function as the vibration plate. The vibration plate 230 may be omitted, and only the first electrodes 10 may function as the vibration plate. When the first electrodes 10 are directly provided on the flow path formation substrate 210, the first electrodes 10 are preferably protected by an insulating protection film or the like so that a liquid is not in contact with the first electrodes 10.

The first electrode 10 is configured as an individual electrode for each pressure generation chamber 211. A width of the first electrode 10 in the Y-axis direction is smaller than the width of the pressure generation chamber 211 in the Y-axis direction. A length of the first electrode 10 in the X-axis direction is larger than a length of the pressure generation chamber 211 in the X-axis direction. In the X-axis direction, both ends of the first electrode 10 are located with both ends of the pressure generation chamber 211 sandwiched therebetween. A lead electrode 202 is coupled to an end of the first electrode 10 in a −X-axis direction.

A width of the piezoelectric layer 20 in the Y-axis direction is, for example, larger than the width of the first electrode 10 in the Y-axis direction. A length of the piezoelectric layer 20 in the X-axis direction is, for example, larger than the length of the pressure generation chamber 211 in the X-axis direction. An end of the first electrode 10 in the +X-axis direction is located, for example, between an end of the piezoelectric layer 20 in the +X-axis direction and the end of the pressure generation chamber 211 in the +X-axis direction. The end of the first electrode 10 in the +X-axis direction is covered by the piezoelectric layer 20. On the other hand, an end of the piezoelectric layer 20 in the −X-axis direction is located, for example, between the end of the first electrode 10 in the −X-axis direction and the end of the pressure generation chamber 211 in the −X-axis direction. The end of the first electrode 10 in the −X-axis direction is not covered by the piezoelectric layer 20.

The second electrode 30 is continuously provided, for example, on the piezoelectric layers 20 and the vibration plate 230. The second electrode 30 is configured as a common electrode common to the plurality of piezoelectric elements 100.

The protection substrate 240 is bonded to the flow path formation substrate 210 by an adhesive 203. A through hole 242 is provided in the protection substrate 240. In the shown example, the through hole 242 penetrates the protection substrate 240 in a Z-axis direction and communicates with the third communication path 215. The through hole 242 and the third communication path 215 constitute the manifold 216 serving as the common liquid chamber of the pressure generation chambers 211. Further, a through hole 244 that penetrates the protection substrate 240 in the Z-axis direction is provided in the protection substrate 240. Ends of the lead electrodes 202 are located in the through hole 244.

An opening 246 is provided in the protection substrate 240. The opening 246 is a space that does not hinder driving of the piezoelectric elements 100. The opening 246 may be sealed or may not be sealed.

The circuit substrate 250 is provided on the protection substrate 240. The circuit substrate 250 includes a semiconductor integrated circuit (IC) that drives the piezoelectric elements 100. The circuit substrate 250 and the lead electrodes 202 are electrically coupled to each other via a coupling wire 204.

The compliance substrate 260 is provided on the protection substrate 240. The compliance substrate 260 includes a sealing layer 262 provided on the protection substrate 240 and a fixing plate 264 provided on the sealing layer 262. The sealing layer 262 is a layer that seals the manifold 216. The sealing layer 262 has, for example, flexibility. A through hole 266 is provided in the fixing plate 264. The through hole 266 penetrates the fixing plate 264 in the Z-axis direction. The through hole 266 is provided at a position overlapping the manifold 216 when viewed from the Z-axis direction.

4. Printer

Figure 5:
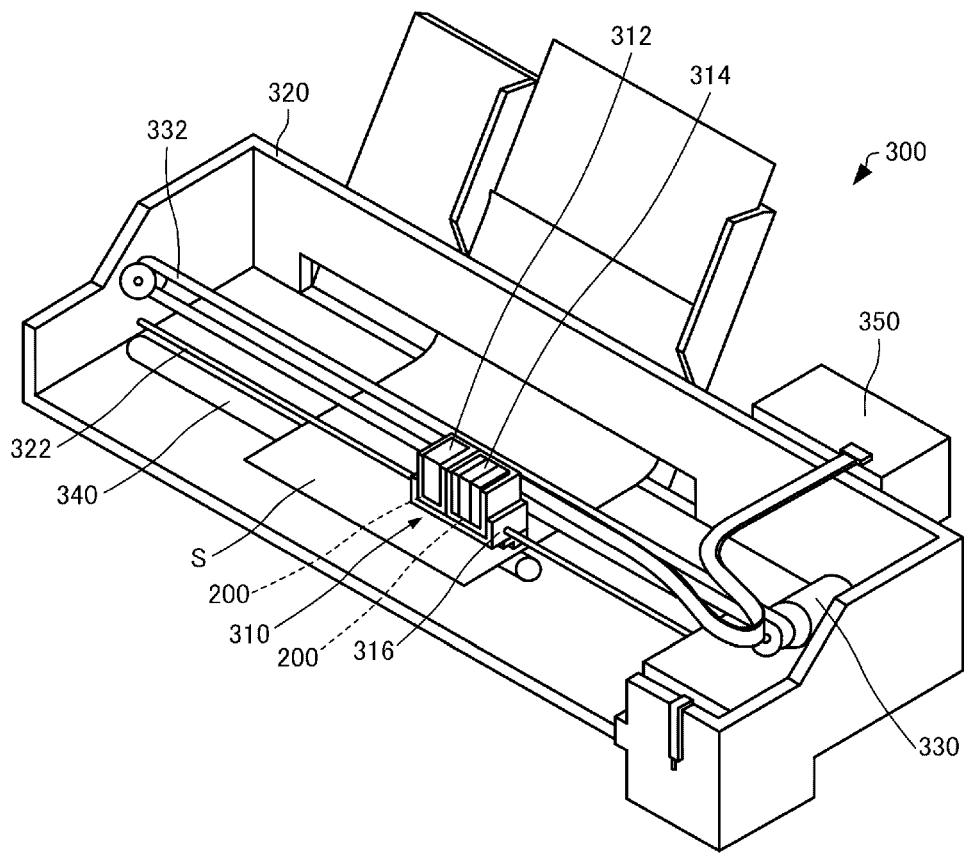
FIG. 5 is a perspective view schematically showing a printer according to the present embodiment.

Next, a printer according to the present embodiment will be described with reference to the drawings. FIG. 5 is a perspective view schematically showing a printer 300 according to the present embodiment.

The printer 300 is an ink-jet printer. As shown in FIG. 5, the printer 300 includes a head unit 310. The head unit 310 includes, for example, the liquid discharge head 200. The number of the liquid discharge heads 200 is not particularly limited. A cartridge 312 and a cartridge 314 that constitute a supply unit are detachably provided in the head unit 310. A carriage 316 on which the head unit 310 is mounted is provided on a carriage shaft 322 attached to an apparatus main body 320, such that the carriage 316 is movable in a direction of the shaft, and a liquid supplied from a liquid supply unit is discharged.

Here, the liquid may be a material in a state when a substance is in a liquid phase, and a material in a liquid state such as a sol or a gel is also included in the liquid. Further, the liquid includes not only the liquid serving as a state of a substance but also a liquid or the like in which particles of a functional material formed of a solid material such as a pigment or metal particles are dissolved, dispersed or mixed in a solvent. Representative examples of the liquid include ink and a liquid crystal emulsifier. The ink includes general water-based ink and oil-based ink, as well as various liquid compositions such as gel ink and hot-melt ink.

In the printer 300, a driving force of a driving motor 330 is transmitted, via a plurality of gears (not shown) and a timing belt 332, to the carriage 316, so that the carriage 316 on which the head unit 310 is mounted is moved along the carriage shaft 322. On the other hand, the apparatus main body 320 is provided with a transport roller 340 serving as a transport mechanism that moves a sheet S, which is a recording medium such as paper, relative to the liquid discharge head 200. The transport mechanism that transports the sheet S is not limited to the transport roller, and may be a belt, a drum, or the like.

The printer 300 includes a printer controller 350 serving as a control unit that controls the liquid discharge head 200 and the transport roller 340. The printer controller 350 is electrically coupled to the circuit substrate 250 of the liquid discharge head 200. The printer controller 350 includes, for example, a random access memory (RAM) that temporarily stores various kinds of data, a read only memory (ROM) that stores a control program and the like, a central processing unit (CPU), and a driving signal generation circuit that generates a driving signal for a supply to the liquid discharge head 200.

The piezoelectric element 100 can be used not only for the liquid discharge head and the printer, but also for a wide range of applications. The piezoelectric element 100 is preferably used as, for example, a piezoelectric actuator for an ultrasonic motor, a vibration dust-removing apparatus, a piezoelectric transformer, a piezoelectric speaker, a piezoelectric pump, a pressure electric converter, and the like. Further, the piezoelectric element 100 is preferably used as, for example, a piezoelectric sensor element for an ultrasonic detector, an angular velocity sensor, an acceleration sensor, a vibration sensor, a tilt sensor, a pressure sensor, a collision sensor, a human detection sensor, an infrared sensor, a terahertz sensor, a heat detection sensor, a pyroelectric sensor, a piezoelectric sensor, and the like. Further, the piezoelectric element 100 is preferably used as a ferroelectric element for a ferroelectric memory (FeRAM), a ferroelectric transistor (FeFET), a ferroelectric calculation circuit (FeLogic), a ferroelectric capacitor, and the like. Further, the piezoelectric element 100 is preferably used as a voltage-controlled optical element for a wavelength converter, an optical waveguide, an optical path modulator, a refractive index control element, an electronic shutter mechanism, and the like.

5. Examples and Comparative Examples

5.1. Preparation of Sample

5.1.1. Example 1

In Example 1, a silicon substrate of six inches was thermally oxidized to form a silicon dioxide layer on the silicon substrate. Next, a zirconium layer was formed at the silicon dioxide layer by the sputtering method and thermally oxidized to form a zirconium oxide layer. Next, while being heated to 450° C., a platinum layer having a thickness of 50 nm was formed as the first electrode on a zirconia oxide layer by the sputtering method.

Next, an upper surface of the first electrode was subjected to, using an oxygen plasma ashing apparatus, oxygen plasma ashing for 0.5 minutes under conditions of a radio frequency (RF) power of 1200 W, a gas pressure of 800 mTorr, and a temperature of 90° C.

Next, the piezoelectric layer was formed at the first electrode by the following procedure.

A precursor solution containing potassium 2-ethylhexanoate, sodium 2-ethylhexanoate, niobium 2-ethylhexanoate, and manganese 2-ethylhexanoate was prepared to be $(K_{0.4}Na_{0.6})(Nb_{0.995}Mn_{0.005})O_3$. Next, the precursor solution was applied to the first electrode by a spin coating method. Thereafter, drying at 180° C. and degreasing at 350° C. were performed, and a heat treatment was performed using an RTA apparatus at 750° C. for three minutes. Accordingly, the piezoelectric layer having a thickness of 70 nm was formed at the first electrode.

5.1.2. Example 2

Example 2 is the same as Example 1 except that an upper surface of the first electrode was subjected to oxygen plasma ashing for five minutes.

5.1.3. Example 3

Example 3 is the same as Example 1 except that an upper surface of the first electrode was irradiated with UV light having a wavelength of 172 nm by a UV lamp in a vacuum atmosphere for ten minutes instead of being subjected to oxygen plasma ashing.

5.1.4 Comparative Example 1

Comparative Example 1 is the same as Example 1 except that an upper surface of the first electrode was not subjected to oxygen plasma asking.

5.2 XPS Evaluation

The upper surface of the first electrode before forming the piezoelectric layer was evaluated by XPS. The XPS was performed using "ESCALAB 250" manufactured by the Thermo Fisher Scientific Company. An X-ray source was evaluated, using Al-Kα rays having a spot diameter of 500 µm², in a state of being irradiated by an electron gun for charge correction. An XPS spectrum of each element was measured at a step interval of 0.1 eV, a pass energy of 20 eV, and a storage time of 100 ms. In order to reduce a change in a chemical state due to X-ray damage, five or more points were measured and averaged for each sample to obtain measurement data. Energy axis calibration of an apparatus of the XPS was performed using Au, Ag, and Cu, and an energy axis of each measured sample was calibrated to have a peak derived from C1s, C—C, and C—H as 284.8 eV.

Figure 6:
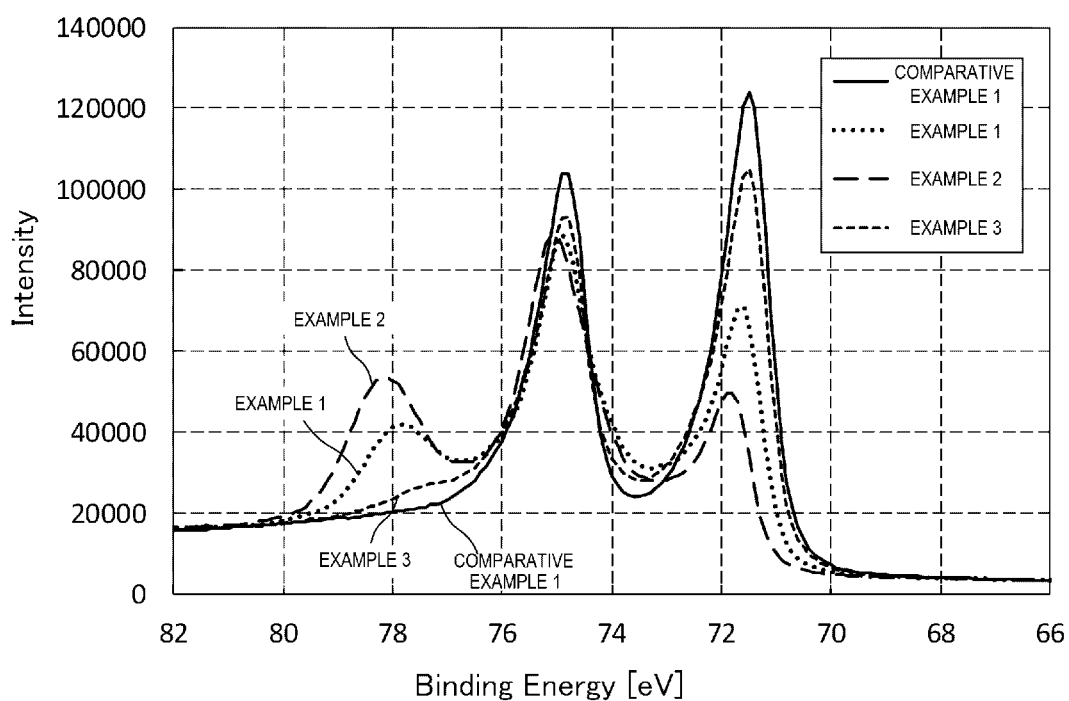
FIG. 6 is a diagram showing XPS measurement results.

FIG. 6 shows XPS measurement results of Examples 1 to 3 and Comparative Example 1. As shown in FIG. 6, in Examples 1 to 3, when a binding energy is 77 eV or more and 80 eV or less, and more specifically, is 77.5 eV or more and less than 78.5 eV, peaks derived from a bond Pt—O between a platinum atom and an oxygen atom are confirmed. A peak derived from the Pt—O is shifted to a high energy side when processing time of the oxygen plasma asking is increased. On the other hand, in Comparative Example 1, no peak derived from a bond Pt—O is confirmed. A peak whose binding energy is confirmed near 72 eV corresponds to platinum 4f7/2, and a peak confirmed near 75 eV is a peak derived from platinum 4f5/2.

An atomic concentration of carbon on the first electrode was calculated based on a peak intensity obtained by the XPS. As a result, Example 1 is 9.8 at %, Example 2 is 9.1 at %, Example 3 is 13.5 at %, and Comparative Example 1 is 19.0 at %.

5.3. XRD Evaluation

The piezoelectric layer provided on the first electrode was evaluated by XRD. The XRD was performed using "D8 DISCOVER with GADDS" manufactured by the Bruker company. Measurement was performed in the following conditions: tube voltage: 50 kV, tube current: 100 mA, detector distance: 15 cm, collimator diameter: 0.3 mm, measurement time: 480 seconds. Obtained 2D data was converted into an X-ray analysis intensity curve using attached software with 2θ range: 20° to 50°, X range: −95° to −85°, step width: 0.02°, and intensity normalization method: Bin normalized.

In all Examples 1 to 3, a peak derived from a (100) plane of KNN is confirmed, and the piezoelectric layer is (100) preferentially oriented.

Figure 7:
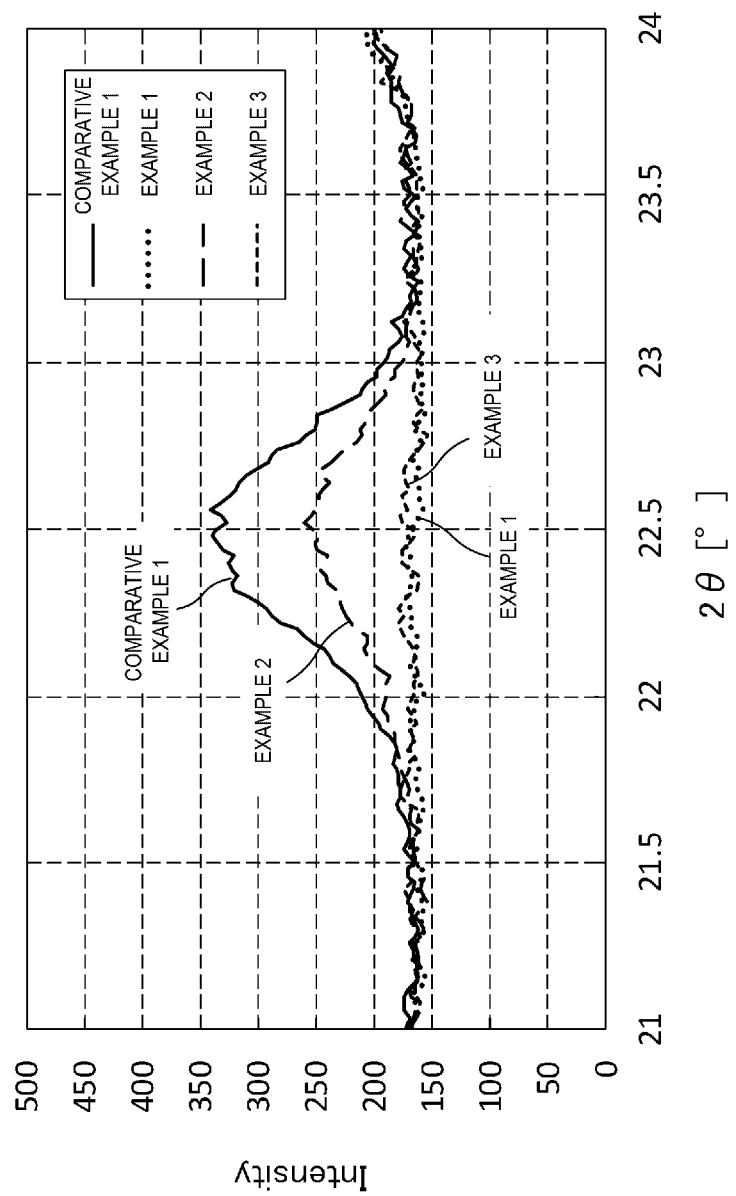
FIG. 7 is a diagram showing XRD measurement results.

FIG. 7 shows XRD measurement results of Examples 1-3 and Comparative Example 1. FIG. 7 shows the XRD measurement results when a silicon substrate is tilted by 54.74 degrees in a ψ direction so that a peak derived from a (111) plane of the KNN can be confirmed.

As shown in FIG. 7, in Examples 1 and 3, no peak derived from the (111) plane of the KNN is confirmed. In Example 2, a peak derived from the (111) plane of the KNN is confirmed, but an intensity of the peak is smaller than that of Comparative Example 1.

From FIGS. 6 and 7, it is found that the KNN is easy to be (100) preferentially oriented when the bond Pt—O occurs on the upper surface of the first electrode. Further, it is found that an orientation rate $I_{(100)}/I_{ALL}$ of the (100) plane of the KNN is increased when the bond Pt—O occurs on the upper surface of the first electrode.

The present disclosure is not limited to the embodiment described above, and various modifications can be made. For example, the present disclosure includes a configuration substantially the same as that described in the embodiment. The substantially same configuration is, for example, a configuration in which a function, a method, and a result are the same as those described in the embodiment, or a configuration in which an object and an effect are the same as those described in the embodiment. Further, the present disclosure includes a configuration in which non-essential portions of the configuration described in the embodiment are replaced. Further, the present disclosure includes a configuration having operational effects same as those of the configuration described in the embodiment, or a configuration in which an object same as that of the configuration described in the embodiment can be achieved. Further, the present disclosure includes a configuration in which a known technology is added to the configuration described in the embodiment.

What is claimed is:

1. A piezoelectric element comprising:
a first electrode provided on a base;
a piezoelectric layer provided on the first electrode and containing a complex oxide which has a perovskite structure and contains potassium, sodium, and niobium; and
a second electrode provided on the piezoelectric layer, wherein
the first electrode contains platinum,
the first electrode is (111) preferentially oriented,
a platinum atom contained in the first electrode is bonded to an oxygen atom at an interface between the first electrode and the piezoelectric layer, and
carbon is present at the interface in a concentration that is greater than 9.1 at % and less than 19 at %.

2. The piezoelectric element according to claim 1, wherein
the piezoelectric layer is (100) preferentially oriented.

3. A liquid discharge head comprising:
the piezoelectric element according to claim 1; and
a nozzle plate provided with a nozzle hole from which a liquid is discharged, wherein
the base includes a flow path formation substrate provided with a pressure generation chamber whose volume is changeable by the piezoelectric element, and
the nozzle hole communicates with the pressure generation chamber.

4. A printer comprising:
the liquid discharge head according to claim 3;
a transport mechanism configured to move a recording medium relative to the liquid discharge head; and
a control unit configured to control the liquid discharge head and the transport mechanism.

* * * * *